United States Patent [19]
Hwang et al.

[11] Patent Number: 5,871,812
[45] Date of Patent: Feb. 16, 1999

[54] APPARATUS AND METHOD FOR DEPOSITING MOLECULAR IMPURITIES ON A SEMICONDUCTOR WAFER

[75] Inventors: Jung-Sung Hwang; Dong-Joo Lee; Nam-Hee You; Sang-Young Moon, all of Kyungki-do, Rep. of Korea

[73] Assignee: Samsung Electronics Co., Ltd., Suwon, Rep. of Korea

[21] Appl. No.: 773,879

[22] Filed: Dec. 26, 1996

[30] Foreign Application Priority Data

Dec. 29, 1995 [KR] Rep. of Korea .................. 1995-67537

[51] Int. Cl.[6] .................................................. C23C 16/00
[52] U.S. Cl. ........................................ 427/248.1; 118/715
[58] Field of Search .......................... 427/248.1; 118/715

[56] References Cited

PUBLICATIONS

Gary Geschwing et al., Wafer Particle Deposition and Surface Particle Validation, IEEE/SEMI 1995 Advanced Semiconductor Manufacturing Conference & Workshop, Institute of Electrical & Electronics Engineers, Inc., New York, Nov. 1995, pp. 455–463.

Keiko Kanzawa et al., "A Semiconductor Device Manufacturer's Efforts for Controlling and Evaluating Atmospheric Pollution", 1995 IEEE/SEMI Advanced Semiconductor Manufacturing Conference, pp. 190–193.

Makiko Tamaoki et al., "The Effect of Airborne Contaminants in the Cleanroom for ULSI Manufacturing Process", 1995 IEEE/SEMI Advanced Semiconductor Manufacturing Conference, pp. 322–326.

*Primary Examiner*—Richard Bueker
*Attorney, Agent, or Firm*—Jones & Volentine, L.L.P.

[57] ABSTRACT

An apparatus for quantitatively depositing molecular impurities on a semiconductor wafer, includes a reaction chamber, a gas generator for generating a source gas serving as the molecular impurities, a humidifier for generating moisture vapour of a constant temperature, a mixer for mixing the source gas and the moisture vapour to generate a mixed gas, a gas injector for injecting the mixed gas into the reaction chamber, an exhausting part for initiating a vacuum condition in the reaction chamber before deposition of the molecular impurities and for exhausting a remaining gases after deposition of the molecular impurities, and a cleaning air supply portion for supplying a cleaning air into the reaction chamber before deposition of the molecular impurities. After fabricating a semiconductor device using the wafer processed as above, a defective source of mechanism of contamination can be traced by analysing the semiconductor device.

8 Claims, 3 Drawing Sheets

APPARATUS AND METHOD FOR DEPOSITING MOLECULAR IMPURITIES ON A SEMICONDUCTOR WAFER

BACKGROUND OF THE INVENTION

1. Field of the Invention

The present invention relates to an apparatus and method for depositing molecular impurities on a semiconductor wafer, and more particularly, to an apparatus that can quantitatively deposit expected molecular impurities on a semiconductor wafer so as to trace the cause of a defective semiconductor device.

2. Description of the Related Art

In the process steps for fabricating a semiconductor device, it is very important to optimally control molecular impurities because the molecular impurities within the clean room cause many problems and can exert a harmful influence upon the semiconductor device, which has a high degree of integration.

In a clean room, a secondary air current is generated by the movement of many items, such as production facilities, measuring instruments, produced devices, workers, robots for production, an unbalance of a spacial temperature, and so on. Because particles (i.e., fine dusts) adjacent to the moving objects are moved due to the secondary air current, wafers may be contaminated with the moving particles. It is thus important to remove such particles in the clean room to enhance the productivity of the semiconductor devices fabricated therein.

In addition, as the process steps for fabricating a semiconductor device become more complicated and take longer to complete, the wafers are contaminated more and more. The particles on wafers generate electric charges or cause crystallization defects.

Furthermore, since particles are accumulated from one another, the production device yield is influenced by a very small amount of contamination source. Therefore, it is necessary to trace the cause of several defective semiconductor devices, analyse the defective mechanism, and predetermine a contamination control level and a process limitation caused by the contamination source.

SUMMARY OF THE INVENTION

It is therefore an object of the invention to provide an apparatus, which can quantitatively deposit molecular impurities on a semiconductor wafer so as to trace a defective source of a defective semiconductor device.

According to an aspect of the present invention, there is provided an apparatus for depositing molecular impurities on a semiconductor wafer, comprising: a reaction chamber; means for generating a source gas serving as the molecular impurities; a humidifier for generating moisture vapour at a constant temperature; a mixer for mixing the source gas and the moisture vapour to generate a mixed gas; an injector for injecting the mixed gas into the reaction chamber to deposit the mixed gas on the wafer; means for initiating a vacuum condition in the reaction chamber before injection of the mixed gas, and for exhausting remaining gases after deposition of the mixed gas; and means for supplying cleaning air into the reaction chamber before the injection of the molecular impurities.

The source gas is one of an organic material and an inorganic material. The apparatus further comprises a gas concentration controller for controlling the concentration of the molecular impurities by injecting a pure gas into the gas generator, and a humidity control valve for controlling the humidity of the mixed gas.

The injector includes a height controller for controlling a depositing area on the semiconductor wafer by raising and lowering the injector. The injector is of spherical shape and has a plurality of injection holes at a bottom of the injector.

In another aspect, there is provided a method for depositing molecular impurities on a semiconductor wafer, comprising the steps of: supplying cleaning air into a reaction chamber; exhausting the cleaning air containing impurities; loading a wafer in the reaction chamber; mixing a source gas and a moisture vapour to generate a mixed gas of molecular impurities; depositing the mixed gas on the wafer; and exhausting remaining gases from the reaction chamber.

The method further comprises the steps of generating the moisture vapour at a constant temperature prior to the mixing step; initiating a vacuum condition in the reaction chamber before the depositing step; and unloading the wafer from the reaction chamber after the exhausting step.

The apparatus of the present invention can quantitatively deposit molecular impurities on a semiconductor wafer. By analysing the quantitatively deposited molecular impurity film on the wafer, a defective source or mechanism of a defective semiconductor device can be traced.

BRIEF DESCRIPTION OF THE DRAWINGS

The accompanying drawings illustrate an embodiment of the invention, and, together with the description, serve to explain the principles of the invention, in which.

DESCRIPTION OF THE PREFERRED EMBODIMENTS

Figure 1:
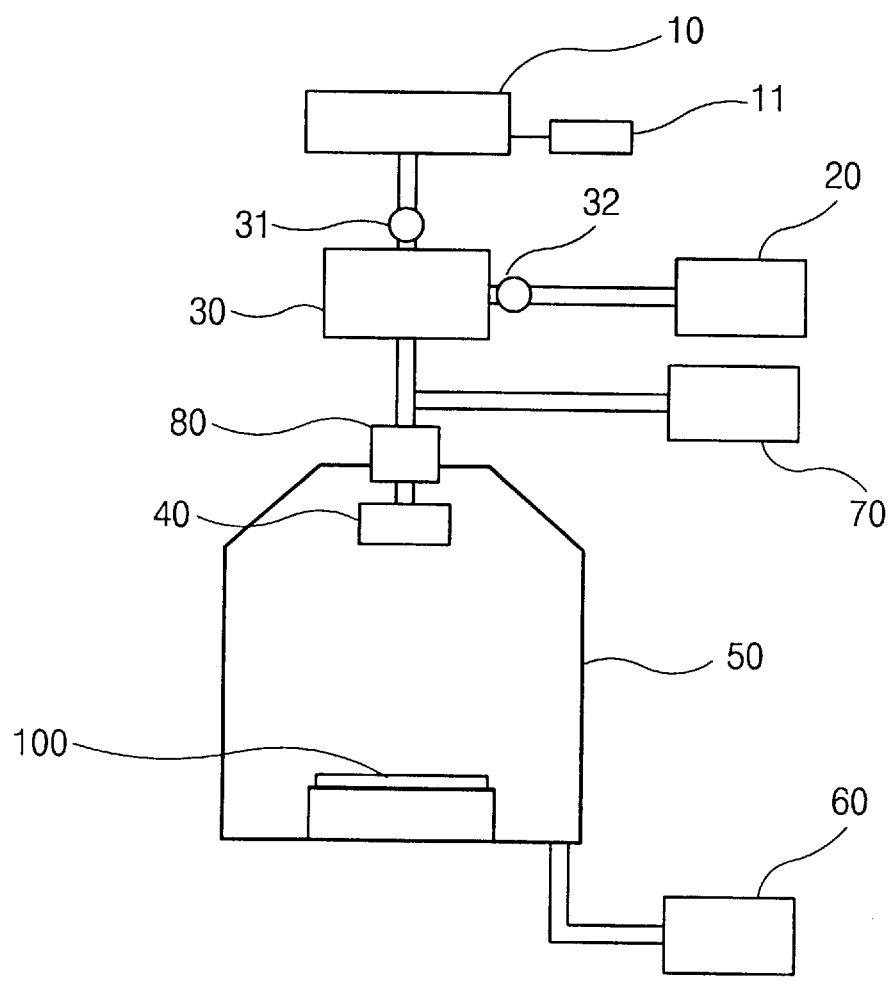
FIG. 1 is a schematic view illustrating an apparatus for depositing molecular impurities in accordance with a preferred embodiment of the present invention.

Referring to FIG. 1, there is schematically illustrated a novel apparatus for depositing molecular impurities on a semiconductor wafer 100. The apparatus includes a reaction chamber 50 wherein the semiconductor wafer 100 is placed on a wafer stage 102 to form the molecular impurities thereon. A gas generator 10 is provided to generate a source gas serving as the molecular impurity source. The gas generator 10 is provided with a gas concentration controller 11, for supplying a pure gas into the gas generator 10, and for controlling the concentration of the source gas and keeping it constant. The source gas is supplied through a gas control valve 31 to a mixer 30.

A humidifier 20 is provided to generate moisture vapour at a constant temperature. The moisture vapour is supplied through a humidity control valve 32 to the mixer 30. The amount of the moisture vapour may be controlled by the humidity control valve 32. The mixer 30 mixes the source gas and the moisture vapour, and the mixed gas is supplied to a gas injector 40. The gas injector 40, whose up and down movement is controlled by a height controller 80, injects the mixed gas on the semiconductor wafer 100. The distance between the injector 40 and the wafer 100 may be manually changed by the height controller 80. Thus, the area where the source gas is deposited can be accurately controlled depending upon the distance between the injector 40 and the wafer 100.

A cleaning air supply portion 70 is disposed at a gas line for supplying the mixed gas to the injector 40 and is provided to supply cleaning air into the reaction chamber 50 before the injection of the source gas.

Reference numeral 60 in FIG. 1 is an exhausting part having a vacuum pump (not shown). The exhausting part 60 ensures that the reaction chamber 50 is at a vacuum state before injection of the source gas, and exhausts the remaining gas in the reaction chamber 50 after injection of the source gas. The injection of the source gas means that the molecular impurities are deposited on the semiconductor wafer 100. An organic material or an inorganic material may be used as the source gas.

Figure 2:
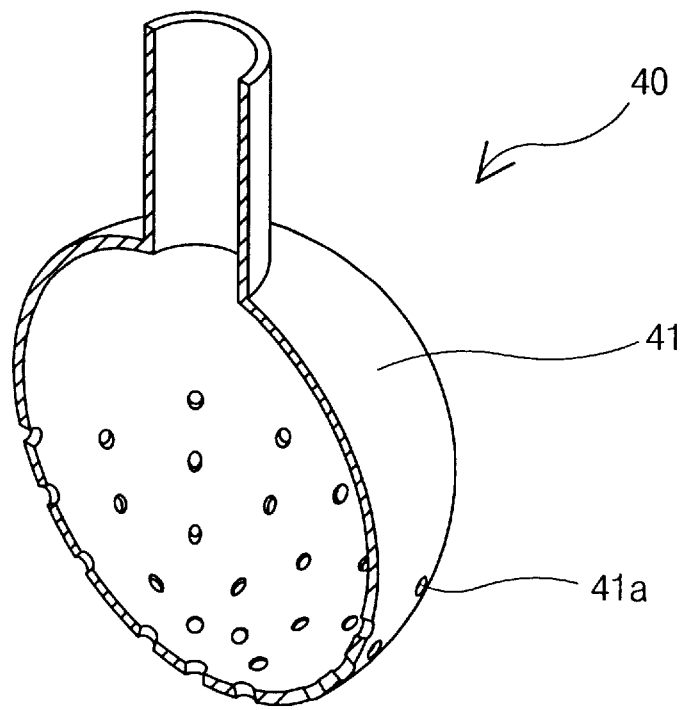
FIG. 2 is a perspective view illustrating a cross section of a gas injection means of a molecular impurity depositing apparatus in accordance with a preferred embodiment of the present invention.

As shown in FIG. 2, the gas injector 40, formed in communication with the gas line, includes a gas injection nozzle 41 of spherical shape. The gas injection nozzle 41 has a plurality of injection holes 41a through which the source gas is spread toward the wafer 100.

Figure 3:
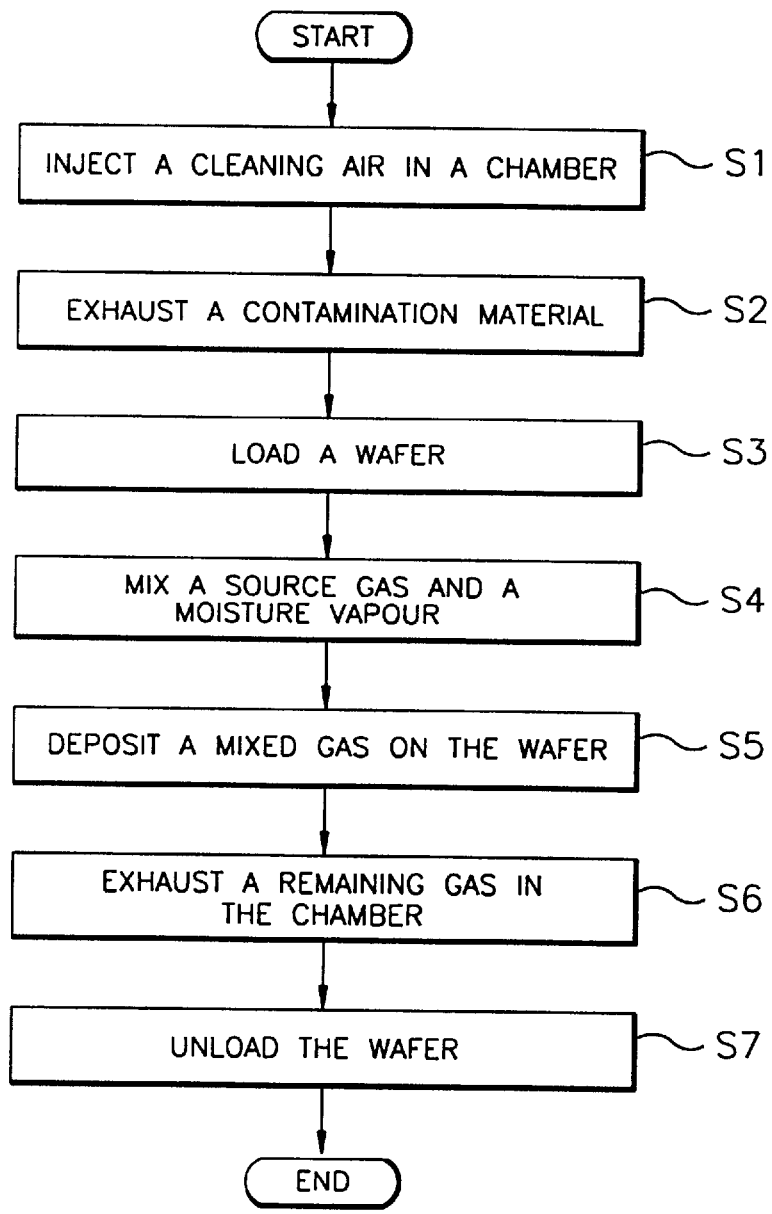
FIG. 3 is a flow chart showing the deposition operation of the apparatus shown in FIG. 1.

The depositing process of the apparatus will be described in detail with reference to FIG. 3 hereinafter.

First, in step S1, clean air generated from the cleaning air supply portion 70 is injected through the gas line into the reaction chamber 50. The exhausting part 60 is then operated so that the injected cleaning air with impurities is exhausted from the chamber 50 (step S2). After cleaning the reaction chamber, a semiconductor wafer 100 is loaded into the reaction chamber 50 and placed on the stage 102 (step S3). Then the source gas, with molecular impurities, from the gas generator 10 and the moisture vapour from the humidifier 20 are mixed in the mixer 30 (step S4). The mixed gas from the mixer 30 is spread over the wafer 100 (step S5) so as to deposit the mixed gas on a desired area of the wafer. After completion of the deposition, gases remaining in the chamber are exhausted by the exhausting part 60 (step S6). Finally, the wafer is unloaded from the chamber (step S7).

During the above deposition, since the concentration and the amount of the mixed gas can be controlled by the valves 31 and 32, the mixed gas can be quantitatively deposited on the wafer. Also, since the nozzle 41 of the gas injector 40 can be manually controlled upward and downward by the height controller 80, the area where the mixed gas is deposited on the wafer can be accurately defined.

The depositing apparatus according to the present invention has an advantage in that molecular impurities, such as organic or inorganic materials, can be quantitatively deposited on a semiconductor wafer. Therefore, when a defective semiconductor device is fabricated using the semiconductor wafer on which the molecular impurities are deposited, the defective mechanism can be traced by analysing the defective semiconductor device.

Additionally, by analysing the defective semiconductor device, an impurity control level and a process limitation caused by a contamination source can be predetermined so as to fabricate good semiconductor devices.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. An apparatus for depositing molecular impurities on a semiconductor wafer, comprising:

a reaction chamber;

means for generating a source gas serving as the molecular impurities;

a humidifier for generating moisture vapour at a constant temperature;

a mixer for mixing the source gas and the moisture vapour to generate a mixed gas;

an injector for injecting the mixed gas into the reaction chamber to deposit the mixed gas on the wafer;

means for initiating a vacuum condition in the reaction chamber before injection of the mixed gas, and for exhausting remaining gases after deposition of the mixed gas; and means for supplying cleaning air into the reaction chamber before the injection of the molecular impurities.

2. The apparatus according to claim 1, wherein said source gas is one of an organic material and an inorganic material.

3. The apparatus according to claim 1, further comprising a gas concentration controller to inject a pure gas into said means for generating a source gas for controlling a concentration of the molecular impurities.

4. The apparatus according to claim 1, further comprising a humidity control valve for controlling humidity of the mixed gas.

5. The apparatus according to claim 1, wherein said injector includes a height controller for raising and lowering the injector to control a depositing area on the semiconductor wafer.

6. The apparatus according to claim 1, wherein said injector is of spherical shape and has a plurality of injection holes at a bottom of the injector.

7. A method for depositing molecular impurities on a semiconductor wafer, comprising the steps of:

supplying cleaning air into a reaction chamber;

exhausting said cleaning air containing impurities;

loading a wafer in the reaction chamber;

mixing a source gas and a moisture vapour to generate a mixed gas of molecular impurities;

depositing the mixed gas on the wafer; and exhausting remaining gases from the reaction chamber.

8. The method according to claim 7, further comprising the steps of:

generating the moisture vapour at a constant temperature prior to the mixing step;

initiating a vacuum condition in the reaction chamber before the depositing step; and unloading the wafer from the reaction chamber after the exhausting step.

\* \* \* \* \*